United States Patent [19]
Downs

[11] Patent Number: 5,890,199
[45] Date of Patent: Mar. 30, 1999

[54] DATA PROCESSOR INCORPORATING A FERROELECTRIC MEMORY ARRAY SELECTABLY CONFIGURABLE AS READ/WRITE AND READ ONLY MEMORY

[75] Inventor: Jeffery E. Downs, Colorado Springs, Colo.

[73] Assignee: Ramtron International Corporation, Colorado Springs, Colo.

[21] Appl. No.: 734,802

[22] Filed: Oct. 21, 1996

[51] Int. Cl.$^6$ ................................................ G06F 12/00
[52] U.S. Cl. ..................... 711/106; 711/106; 711/149; 365/233; 365/195; 365/145; 365/49
[58] Field of Search .................................. 711/106, 149; 365/233, 195, 145, 49

[56] References Cited

U.S. PATENT DOCUMENTS

| | | |
|---|---|---|
| 5,109,521 | 4/1992 | Culley . |
| 5,204,840 | 4/1993 | Mazur ........................................... 5/14 |
| 5,237,699 | 8/1993 | Little et al. ..................................... 1/4 |
| 5,253,197 | 10/1993 | Suzuki et al. .............................. 365/49 |
| 5,255,244 | 10/1993 | Dey .......................................... 365/233 |
| 5,361,343 | 11/1994 | Kosonocky et al. ............... 365/185.11 |
| 5,394,367 | 2/1995 | Downs et al. ........................... 365/195 |
| 5,426,744 | 6/1995 | Sawase et al. ................................. 9/26 |
| 5,426,746 | 6/1995 | Sekiguchi . |
| 5,438,844 | 8/1995 | Hoglund et al. . |
| 5,491,662 | 2/1996 | Pezzini ........................................... 16/6 |
| 5,495,593 | 2/1996 | Elmer et al. . |
| 5,515,540 | 5/1996 | Grider et al. .................................. 1/24 |
| 5,521,417 | 5/1996 | Wada ......................................... 29/76 |
| 5,721,868 | 2/1998 | Yung et al. .............................. 711/149 |
| 5,774,392 | 6/1998 | Kraus et al. ............................. 365/145 |

*Primary Examiner*—Tod R. Swann
*Assistant Examiner*—Nasser Moazzami
*Attorney, Agent, or Firm*—William J. Kubida, Esq.; Holland & Hart LLP

[57] ABSTRACT

A data processor incorporating a memory array which is selectably configurable as either read/write or read only memory or the combination of both read/write and read only memory includes a memory mapper for receiving logical addresses from an arithmetic logic unit ("ALU") and converting the same to physical addresses within the memory array in accordance with configuration instructions stored in a local non-volatile memory. By utilizing a common memory technology for the memory array, such as non-volatile ferroelectric random access memory ("FRAM"), the proportions and layout of the memory array which may be utilized for MPU instructions and data may be selectably controlled. The use of a memory mapper also allows for the establishment of an effective password or encryption protection function for the memory array data of particular utility in conjunction with radio frequency identification ("RF/ID") transponders and other applications which must store sensitive data in non-volatile storage.

57 Claims, 9 Drawing Sheets

DATA PROCESSOR INCORPORATING A FERROELECTRIC MEMORY ARRAY SELECTABLY CONFIGURABLE AS READ/WRITE AND READ ONLY MEMORY

CROSS REFERENCE TO RELATED PATENTS

The present application is related to the subject matter disclosed and claimed in U.S. Pat. No. 5,394,367 issued to Downs et al. on Feb. 28, 1995 for "System and Method for Write-Protecting Predetermined Portions of a Memory Array" assigned to Ramtron International Corporation, Colorado Springs, Colo., assignee of the present invention, the disclosure of which is specifically incorporated herein by this reference.

BACKGROUND OF THE INVENTION

The present invention relates, in general, to the field of integrated circuit ("IC") microprocessors ("MPUs"). More particularly, the present invention relates to an MPU or other data processor IC incorporating a ferroelectric memory array which may be selectably configured as one or more portions of read/write memory and one or more portions of read only memory.

Conventional MPU architectures have long relied on the integration of separate on-board memory arrays utilizing differing architectures. Instructions for overall MPU operation and instruction handling are generally fixed in the form of microcode or "firmware" in read only memory ("ROM") utilizing any one of a number of available ROM technologies such as erasable programmable read only memory ("EPROM") or the like. On the other hand, data upon which the MPU is currently operating and the results of such operations is generally stored at least temporarily in on-board random access memory ("RAM") which allows for data to be written to and read from the RAM.

Because at least two distinct types of memories have been used in conventional MPU design, with each type requiring a differing type of memory technology, designs have been made more complex to layout and process. Moreover, because the amount and configuration of the on-chip RAM and ROM is generally fixed at the time of the device's design and layout, conventional MPU designs have also provided very limited flexibility in allowing for possible variations in the amount of either type of memory for a given specific application.

SUMMARY OF THE INVENTION

Disclosed herein is a data processor incorporating a memory array which is selectably configurable as both read/write and read only memory which includes a configuration, or memory, mapper for receiving logical addresses from an arithmetic logic unit ("ALU") and converts the same to physical addresses within the memory array in accordance with configuration instructions stored in a local non-volatile memory. By utilizing a common memory technology for the memory array, such as non-volatile ferroelectric random access memory architecture ("FRAM®", a registered trademark of Ramtron International Corporation), the proportions and layout of the memory array which may be utilized for MPU instructions and data may be selectably and dynamically controlled. The use of a memory mapper also allows for the establishment of an effective password or encryption protection function for the memory array data of particular utility in conjunction with radio frequency identification ("RF/ID") transponders and other applications which must store sensitive data in non-volatile storage.

Particularly disclosed herein is a data processor comprising a memory array which is selectably configurable as any combination of read/write and read only portions thereof.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
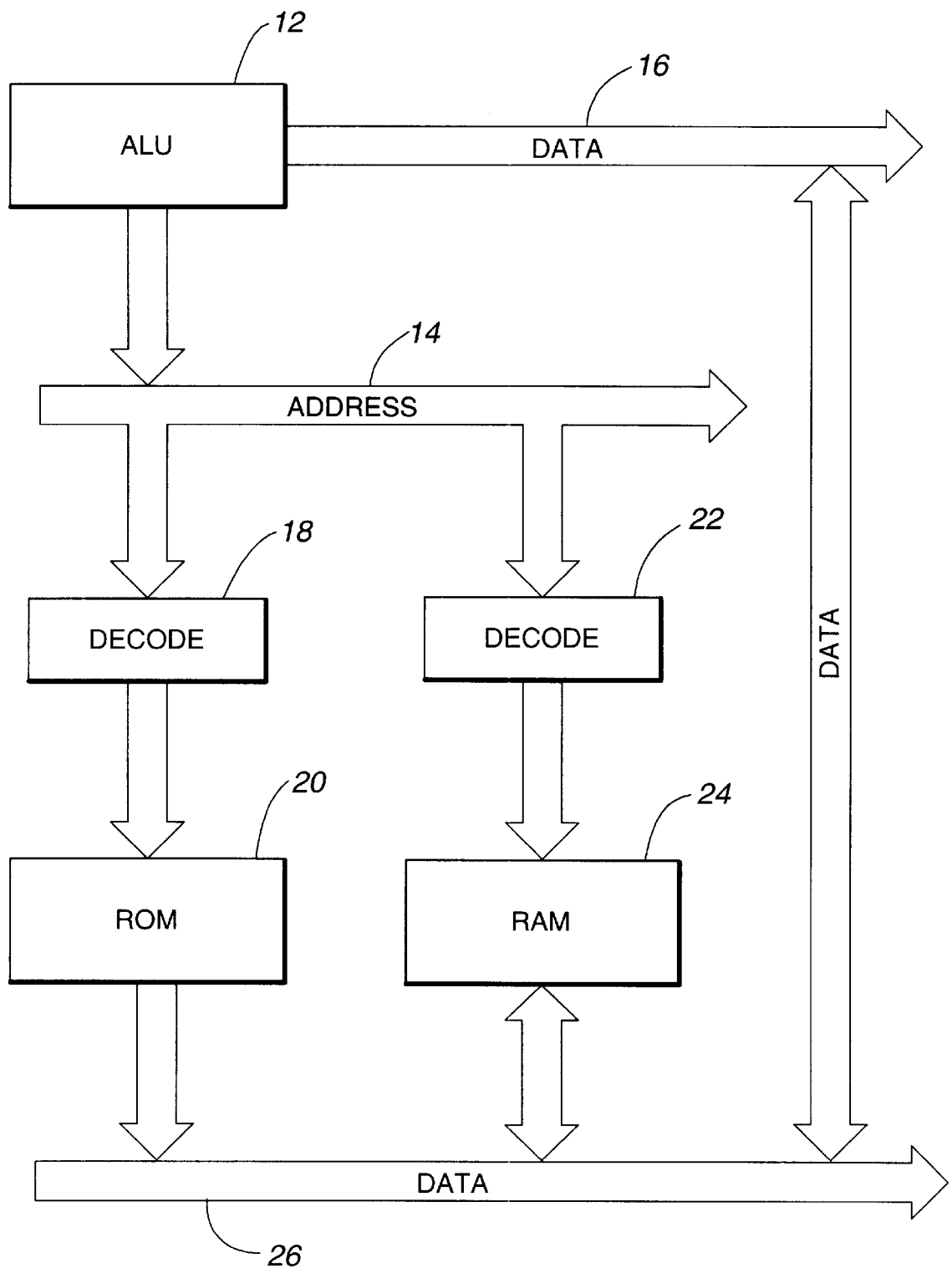
FIG. 1 is a functional block diagram of a representative prior art microprocessor useful in more fully understanding the advantages of the present invention as herein more fully described.

With reference now to FIG. 1, a logical block diagram of a typical prior art microprocessor ("MPU") 10 is shown. The prior art MPU 10 comprises, in pertinent part, an arithmetic logic unit ("ALU") 12 which may also sometimes be referred to as a central processing unit ("CPU"). The ALU 12 is coupled to an address bus 14 and supplies addresses thereon for accessing, inter alia, data held in on-chip storage locations as will be more fully described hereinafter. The ALU 12 is also coupled to a bi-directional data bus 16 as shown such that data information from various sources may be operated on by the ALU 12 and then supplied back to the data bus 16 for subsequent storage.

The address bus 14 supplies addresses to a ROM address decoder 18 which transforms address signals appearing on the address bus 14 to physical locations within a read only memory ("ROM") 20. Data maintained at the physical locations within the ROM 20 (typically program instructions) as accessed by the ALU 12 through the ROM address decoder 18 is supplied unidirectionally to an additional data bus 26 which is then, in turn, coupled to the data bus 16 such that the data maintained within the ROM 20 may be accessed by the ALU 12. As its name implies, the ROM 20 can only have its contents read by the ALU 12 and data cannot be written to it following the initial programming of the device during manufacture of the prior art MPU 10.

The address bus 14 also supplies address signals to a RAM address decoder 22 which, in turn, then translates the address signals to signals for accessing selected memory locations within a random access memory ("RAM") 24. Information (typically program application or end user data) may both be written to and read from the RAM 24 by means of data signals appearing on the additional data bus 26. In this manner, the ALU 12 can write data to or read data from the RAM 24.

With respect to the prior art MPU 10 shown, both the amount of available memory within the ROM 20 and the RAM 24, as well as the relative proportions of the two types of memory is fixed at the time of the layout and manufacture of the prior art MPU 10. In this regard, customization of such a prior art MPU 10 for a particular application would require redesign of the entire part and, as a consequence, specific applications of the part must then generally be constrained to conform to the fixed physical structure of the device as dictated by the amount of available ROM 20 and RAM 24, as well as their relative proportions.

Figure 2:
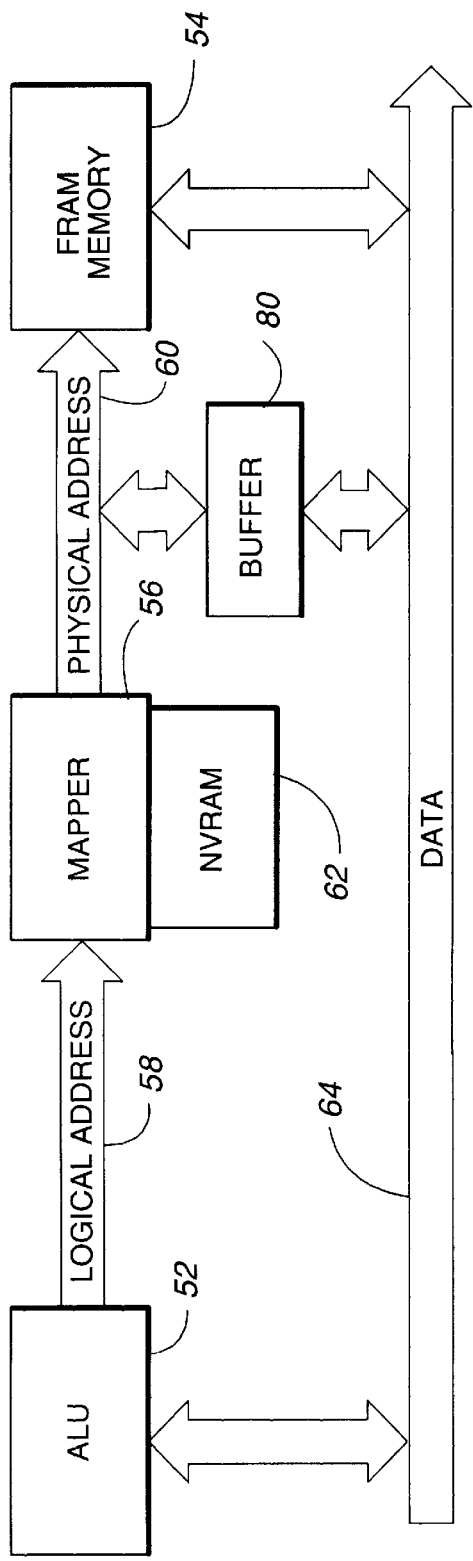
FIG. 2 is a functional block diagram of a representative data processor IC incorporating a ferroelectric memory array which may be selectably configured as one or more portions of read/write memory and one or more portions of read only memory in accordance with the present invention.

With reference now to FIG. 2, a data processor 50 in accordance with the present invention is shown. The data processor 50 comprises, in pertinent part, an ALU 52 and a single non-volatile ferroelectric memory array, such as a ferroelectric random access memory ("FRAM®") 54 which is selectably and dynamically configurable as both read/write and read only memory. The FRAM family of ferroelectric memory devices is available from Ramtron International Corporation, Colorado Springs, Colo., assignee of the present invention and utilizes a proprietary lead zirconate titanate ("PZT") ferroelectric dielectric. The FRAM memory array 54 may also be conveniently provided utilizing a strontium bismuth tantalate ("SBT") dielectric as well.

A memory mapper 56 is interposed between the ALU 52 and the FRAM memory array 54, the function of which will be more fully described hereinafter. A logical address bus 58 couples the ALU 52 to the memory mapper 56 and allows the ALU 52 to supply logical addresses thereon to the memory mapper 56 which, in turn, then supplies physical addresses on a physical address bus 60 to the FRAM memory array 54. The correspondence between the logical addresses on the logical address bus 58 and the physical addresses corresponding to physical locations within the FRAM memory array 54 is controlled by the memory mapper 56 in accordance with specific information maintained in an associated non-volatile random access memory ("NVRAM") 62, which may also comprise a ferroelectric memory array.

A single data bus 64 bidirectionally couples the ALU 52 to the FRAM memory array 54. In operation, the data maintained within the FRAM memory array 54 may be both read only as well as read/write depending on the access allowed to selected portions of the FRAM memory array 54 as controlled by the memory mapper 56 and the NVRAM 62. The FRAM memory array 54 may be utilized to store microprocessor configuration information such as, interrupt control, serial port speeds, I/O port settings, chip selects, interrupt vectors and the like which may then be loaded from the memory array 54 to the ALU 52 upon reset. Moreover, because the logical address to physical address correspondence controlled by the memory mapper 56 can be selectably and dynamically altered, encryption and decryption keys for data stored in the memory array 54 may also be stored therein. In specific applications of this architecture, such as an RF/ID transponder (as will be more fully described hereinafter), passwords to ensure controlled access to data in the memory array 54 may be stored therein as well.

Buffer 80, as will be more fully described hereinafter with respect to FIG. 4, allows the ALU 52 to read and write the contents of the memory mapper 56. This functionality may be utilized, for example, for initialization of the memory mapper 56 by the ALU 52 and for verifying the memory mapper 56 contents.

Figure 3A:
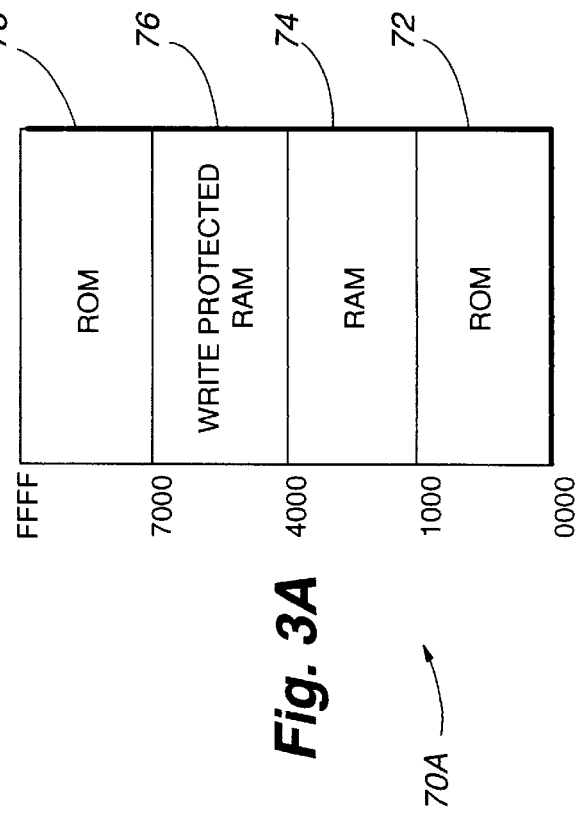
FIG. 3A is an exemplary representation of a memory map of the ferroelectric memory array of FIG. 2 as such may be organized in conjunction with the memory mapper disclosed herein including both random access and read only memory.

With reference additionally to FIG. 3A, an example memory map 70A is shown for the FRAM memory array 54 of the preceding figure. In this exemplary illustration, the memory mapper 56, in accordance with instructions contained within the NVRAM 62 has designated hexadecimal ("HEX") memory addresses from 0000 to 1000 inclusive as read only memory 72. In like manner, memory addresses above 1000 to 4000 inclusive may be designated as RAM 74. Similarly, addresses above 4000 to 7000 inclusive may be configured as write-protected RAM 76. A system and method for write protecting predetermined portions of a memory array is disclosed in the aforementioned U.S. Pat. No. 5,394,367 assigned to the assignee of the present invention, the disclosure of which is herein specifically incorporated by this reference.

HEX addresses above 7000 through FFFF inclusive may also be designated as another portion of ROM 78. By use of the memory mapper 56 and a single non-volatile ferroelectric memory array 54 which is selectably configurable as either read/write or read only memory or a combination of both read/write and read only memory, any combinations of either or both read only memory and read/write memory may be configured in accordance with instructions programmed into the NVRAM 62. Moreover, selected portions of the FRAM memory array 54 (FIG. 2) may also be configured as write-protected RAM 76.

Figure 3C:
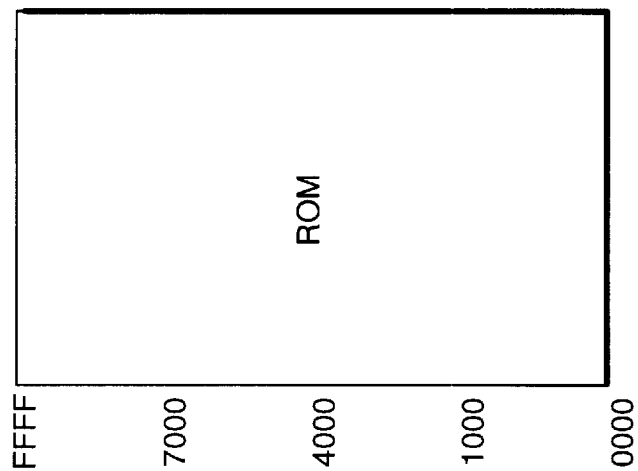
FIG. 3C is a further exemplary representation of a memory map of the ferroelectric memory array of FIG. 2 illustrating an organization as one of entirely read only memory.
Figure 3B:
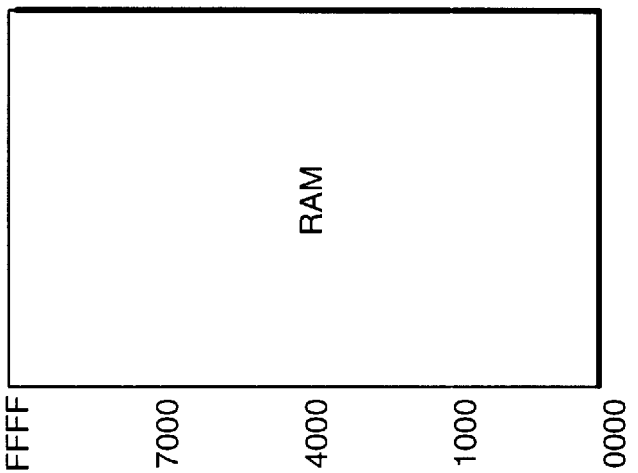
FIG. 3B is an additional exemplary representation of a memory map of the ferroelectric memory array of FIG. 2 illustrating an organization as one of entirely random access memory.

With reference additionally now to FIG. 3B, an example memory map 70B is shown for the FRAM memory array 54 of the preceding figure. In this exemplary illustration, the memory mapper 56, in accordance with alternative instructions contained within the NVRAM 62 has designated hexadecimal ("HEX") memory addresses from 0000 to FFFF inclusive as random access memory.

With reference additionally now to FIG. 3C, an additional example memory map 70C is shown for the FRAM memory array 54 of the preceding figure. In this exemplary illustration, the memory mapper 56, in accordance with differing instructions contained within the NVRAM 62 has designated hexadecimal ("HEX") memory addresses from 0000 to FFFF inclusive as read only memory.

With respect to the preceding FIGS. 3A, 3B and 3C, it should be appreciated by those skilled in the art that the FRAM memory array 54 can be dynamically and selectably configured as all random access memory, all read only memory or any combination thereof inclusive of write protected random access memory. It should be noted, however, that all memory locations within the FRAM memory array 54 are non-volatile and alternative terminology may also be utilized for read only memory such as "write protected" memory and for random access (or read/write) memory such as "not write protected" memory.

Figure 4:
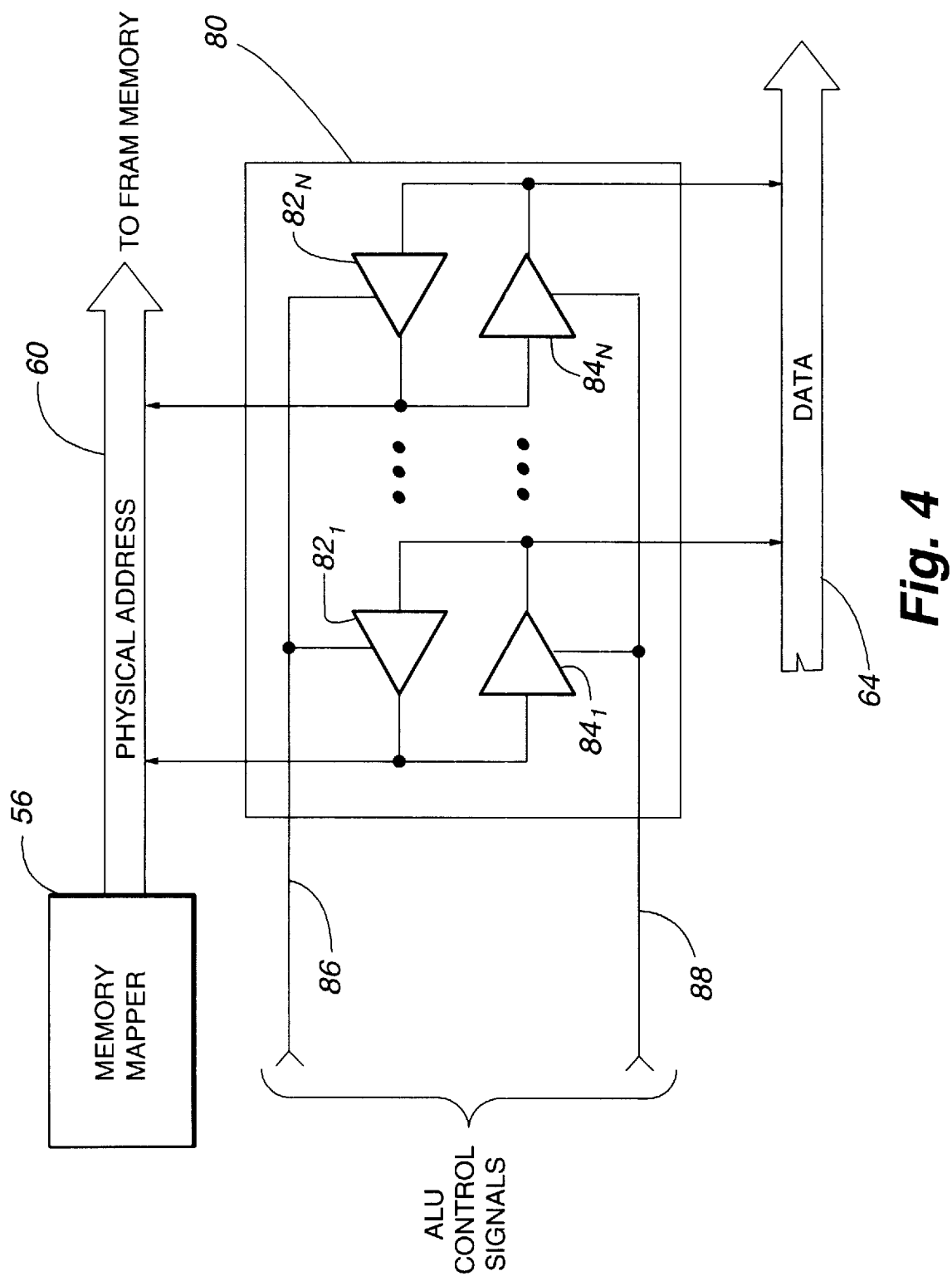
FIG. 4 is a partial functional block diagram of the representative data processor IC of FIG. 2 illustrating in greater detail the buffer circuit controlled by the ALU for bidirectionally coupling data appearing on the physical address bus to the data bus and vice versa.

With reference additionally now to FIG. 4, a buffer circuit 80 is shown which can be utilized to bidirectionally couple the physical address bus 60 to the data bus 64 in certain applications as noted above with respect to FIG. 2. In this regard, the buffer circuit 80 comprises a number of individual buffers $82_1$–$82_N$ for coupling data appearing on the data bus 64 to the physical address bus 60 in response to an enable signal generated by the ALU 52 (not shown) on line 86. In like manner, the buffer circuit 80 also comprises a corresponding number of individual buffers $84_1$–$84_N$ for coupling data appearing on the physical address bus 60 to the data bus 64 in response to a separate enable signal also generated by the ALU 52 on line 88. Through use of the buffer circuit 80, information corresponding to the physical addresses placed on the physical address bus 60 by the memory mapper 56 may also be directly supplied to the ALU 52 in addition to various attribute flags which might be associated with the memory blocks to be accessed in the FRAM memory array 54. Conversely, the buffer circuit 80 allows the NVRAM 62 of the memory mapper 56 to be programmed by the ALU by means of the data bus 64 and a separate write enable signal to be more fully described hereinafter with respect to FIG. 6.

Figure 5:
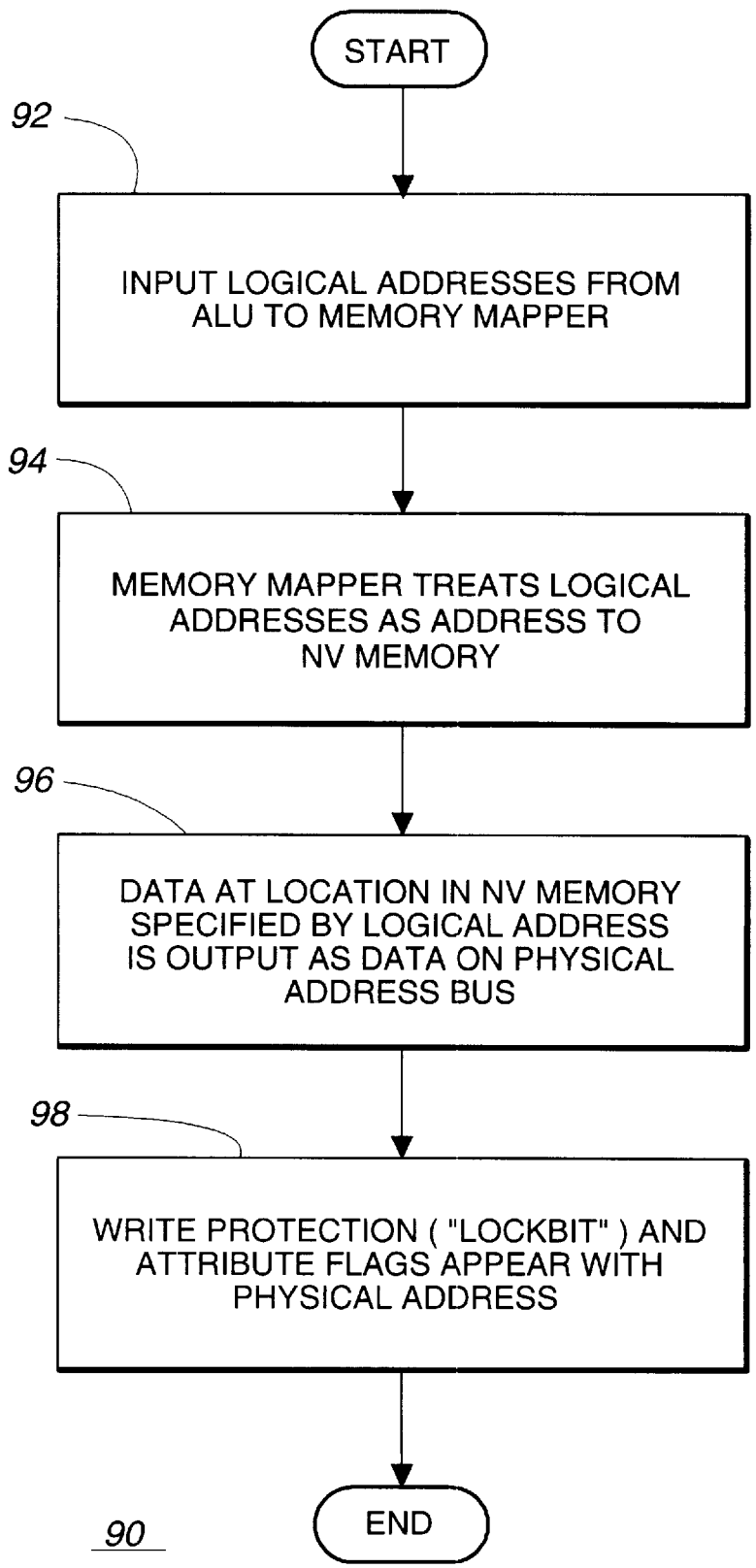
FIG. 5 is a logical flow chart illustrating an exemplary implementation of the functionality of the memory mapper of the preceding figures.

With reference additionally now to FIG. 5, a logical flow chart illustrating an exemplary implementation of a normal translation cycle 90 for the memory mapper 56 of the preceding figures is shown. The translation cycle 90 is initiated by the reception of logical address data from the ALU 52 on the logical address bus 58 at step 92. At succeeding step 94, the memory mapper 56 then treats the logical address data as an address to the associated NVRAM 62. Thereafter at step 96, the data at the resulting data location within the NVRAM 62 specified by the logical address is output as data on the physical address bus 60 for input to the FRAM memory array 54 (or ALU 52 as shown in FIG. 4). In addition, write protection data ("Lockbit") and any associated attribute flags associated with the physical address data are also output at step 98.

Figure 6:
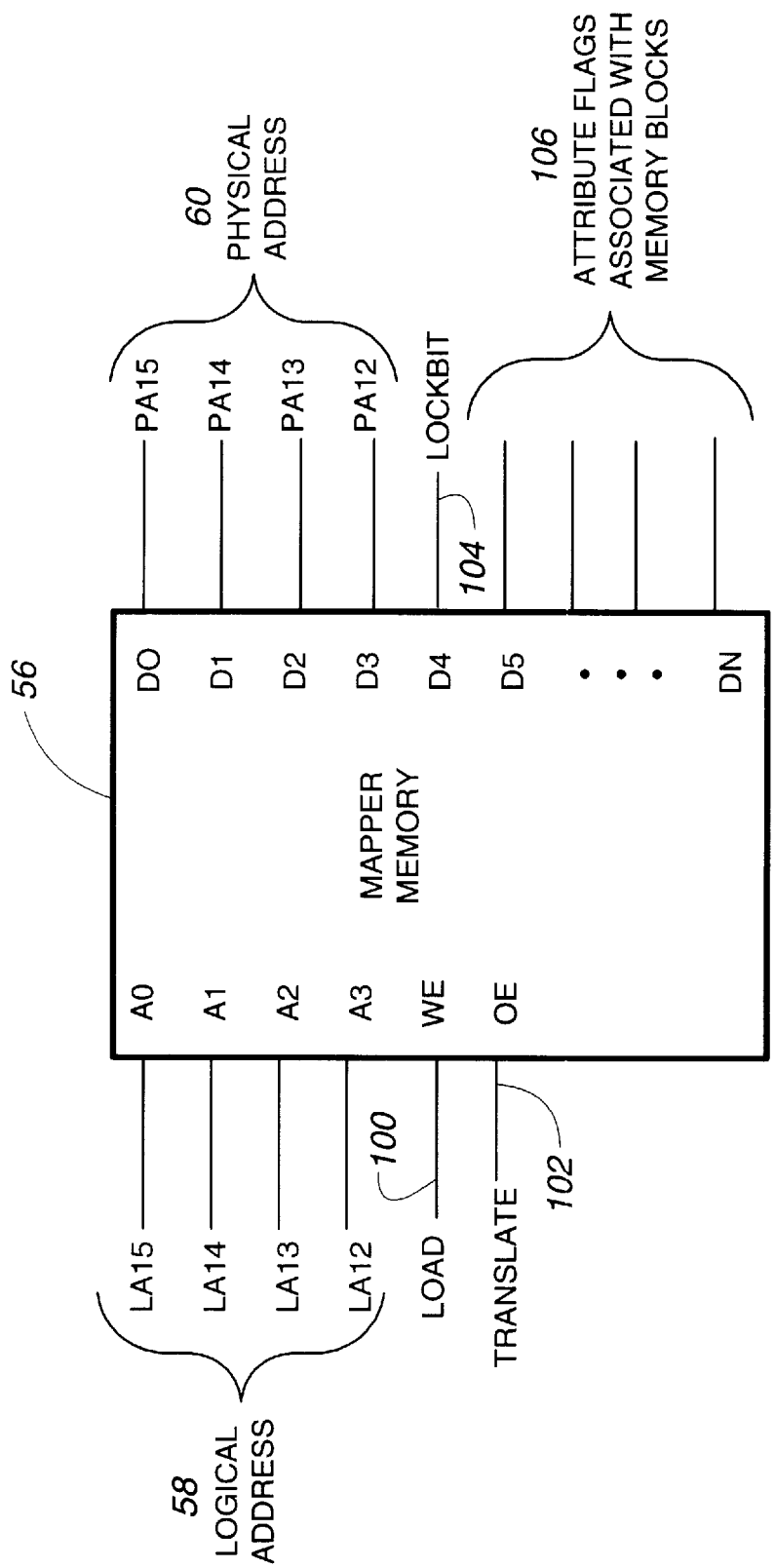
FIG. 6 is a more detailed functional block diagram of the memory mapper of the preceding figures illustrating additional "Translate" and "Load" inputs controlled by the ALU as well as additional outputs thereof for providing, for example, write protection ("Lockbit") inputs to the ferroelectric memory array as well as various attribute flags which might be made available to the ALU.

With reference additionally now to FIG. 6, a more detailed functional block diagram of the exemplary memory mapper 56 of the preceding figures is shown. The memory mapper 56 has a number of inputs $A_0$ through $A_3$ coupled respectively to lines LA15 through LA12 of the logical address bus 58. A load input on line 100 from the ALU 52 (not shown) is supplied to a write enable ("WE") input of the memory mapper 56 to allow for programming of the NVRAM 62 in accordance with data supplied to the data I/O pins on the physical address bus 60 when the buffers $82_1$–$82_N$ of the buffer circuit 80 are enabled as shown in FIG. 4. For example, this allows for configuration of the memory mapper 56 at "boot up" or dynamic reconfiguration during operation in accordance with ALU 52 control. A translate input that is also received from the ALU 52 on line 102 functions as an output enable ("OE") to allow data stored at the locations indicated by the address data on the logical address bus 58 in the NVRAM 62 of the memory mapper 56 to be placed on the physical address bus 60 for input to the FRAM memory array 54. Alternatively, the same data may be placed directly on the data bus 64 for input to the ALU 52 when the buffers $84_1$–$84_N$ of the buffer circuit 80 are enabled as also shown in FIG. 4.

The exemplary memory mapper 56 is also shown to comprise a number of bidirectional data inputs/outputs ($D_0$–$D_N$) of which $D_0$ through $D_3$ are coupled to the physical address bus 60 at lines PA15 through PA12 respectively. Data line $D_4$, in the exemplary illustration shown, may be used to provide a write protection indication ("Lockbit") on line 104 to the FRAM memory array 54 when the corresponding address on the physical address bus 60 is write protected as determined by the contents of the NVRAM 62. Moreover, other data programmed within the NVRAM 62 which also corresponds to the indicated address on the physical address bus 60 may be supplied as attribute flags to the ALU 52 on one or more lines 106 corresponding to data lines $D_5$ through $D_N$.

In this exemplary illustration, the memory mapper 56 is shown as designed for utilization in conjunction with a 64K byte FRAM memory array 54 with 4K bytes of resolution and the memory mapper 56 may comprise a 16×5 bit NVRAM 62. This configuration, illustrated for purposes of example only, would then effectively resolve regions of the FRAM memory array 54 in terms of 16 discrete blocks of memory. It should be noted, however, that the memory mapper 56 may be conveniently designed with any number of logical address inputs ($A_0$–$A_N$) and any number of data outputs ($D_0$–$D_M$) and, when utilized with a 64K byte FRAM memory array 54, 16 address inputs ($A_0$–$A_{15}$) and 16 corresponding data outputs ($D_0$–$D_{15}$) would provide byte level mapping of the FRAM memory array 54.

With respect to such byte level mapping of the FRAM memory array 54, it will be appreciated that such logical address to physical address translation is actually a form of effective data encryption, wherein the memory mapper 56 programming is akin to an encryption key. In fact, any logical address to physical address translation function performed by the memory mapper 56 may be utilized to effectively encrypt the data within the FRAM memory array 54 as will be more fully demonstrated with respect to the succeeding figures.

Figure 7A:
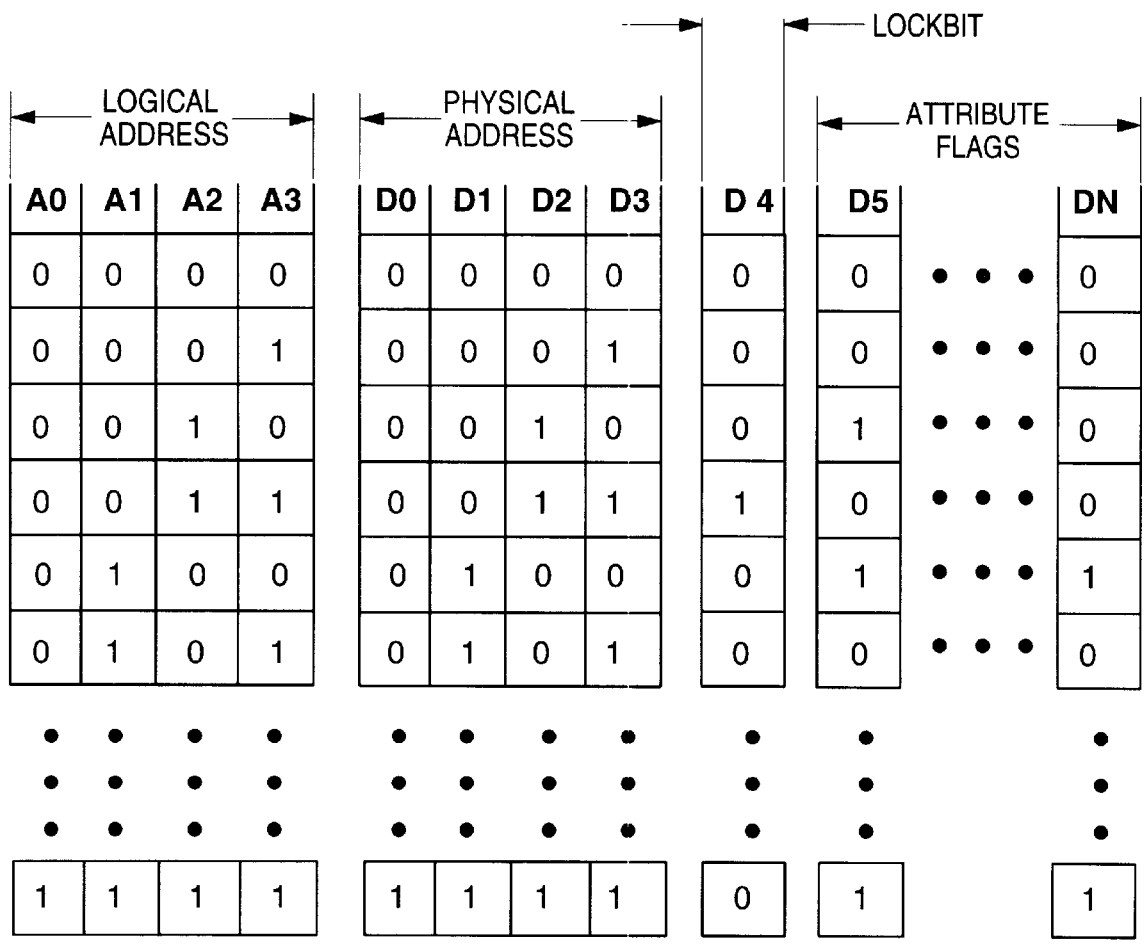
FIG. 7A is a representative chart showing a possible correspondence between logical and physical addresses of the memory mapper functionality of the preceding FIG. 5 and structure of FIG. 6 wherein the memory mapper provides no translation between logical and physical addresses of the 4K byte memory blocks yet may still provide for the generation of lockbit and attribute flags.
Figure 7B:
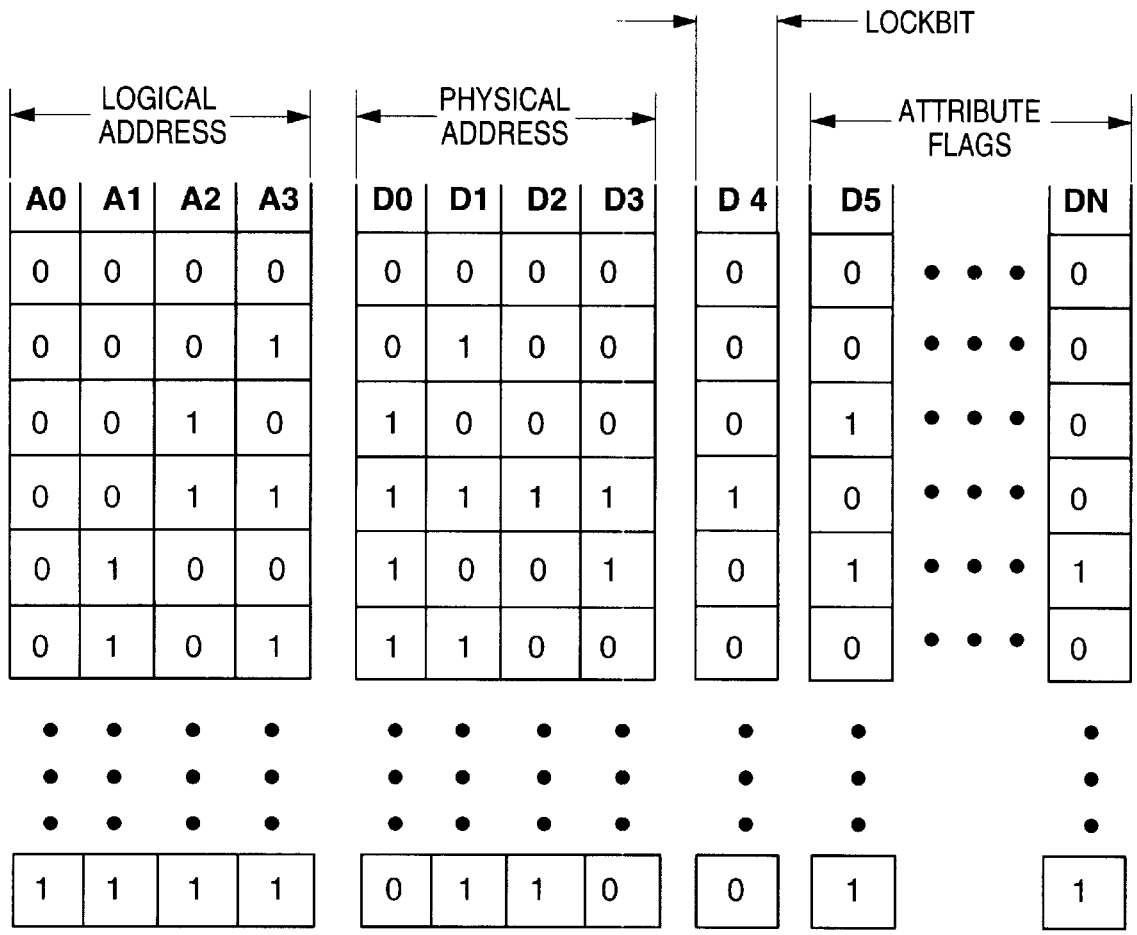
FIG. 7B is a chart comparable to that shown in the preceding FIG. 7A illustrating yet another possible correspondence between logical and physical addresses of the memory mapper functionality of the preceding FIG. 5 and structure of FIG. 6 wherein the memory mapper provides a translation between logical and physical addresses of the 4K byte memory blocks as well as the generation of lockbit and attribute flags.

With reference additionally now to FIG. 7A, a representative chart illustrates a possible correspondence between logical and physical addresses of the memory mapper 56 functionality of the preceding FIG. 5 and structure of FIG. 6. In this figure, the memory mapper 56 provides no translation function between logical and physical addresses of the 4K byte memory blocks yet may still provide for the generation of lockbit and attribute flags as shown. In contrast, FIG. 7B is a chart comparable to that shown in the preceding FIG. 7A illustrating yet another possible correspondence between logical and physical addresses of the memory mapper 56 wherein the memory mapper 56 provides one type of a translation function (block translation) between logical and physical addresses of the 4K byte memory blocks as well as the generation of lockbit and attribute flags. The translation function between logical and physical addresses is an effective encryption of the data in the associated FRAM memory array 54 and can be used for that purpose. Additional applications of this encryption function will be described with respect to a particular application of the aforedescribed technology in conjunction with the succeeding figure.

Figure 8:
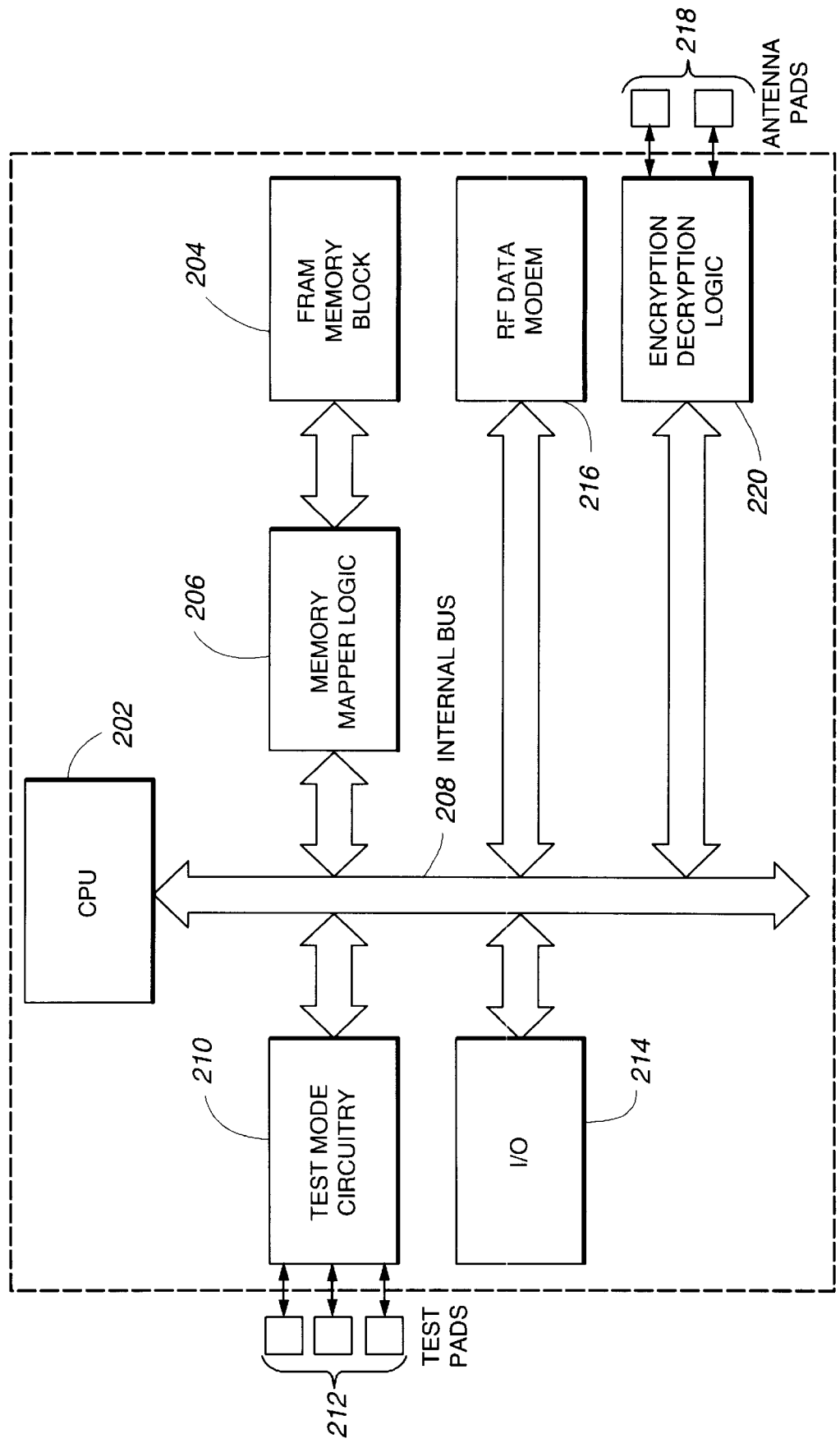
FIG. 8 is a functional block diagram of an implementation of an RF/ID transponder in accordance with a specific application of the present invention.

With reference additionally now to FIG. 8, a radio frequency identification ("RF/ID") transponder 200 is shown. The RF/ID transponder 200 may be conveniently furnished as single monolithically integrated circuit (as shown by the dashed lines) incorporating, inter alia, a data processor 50 (FIG. 2) as aforedescribed. In this regard, the RF/ID transponder 200 includes a CPU (or ALU) 202 a FRAM memory block 204 and an interconnecting memory mapper logic block 206, the function of which is in accordance with those of the data processor 50 (FIG. 2) hereinbefore described.

The CPU 202 is coupled to an internal bus 208 for coupling the same to the memory mapper logic 206 and supplying logical addresses thereon. The internal bus 208 couples the CPU 202 to test mode circuitry 210 which allows external access to test and program the RF/ID transponder 200 through a number of external test pads 212 as shown. Alternatively, the RF/ID transponder 200 may be programmed in accordance with the disclosure contained in U.S. Pat. No. 5,394,367 through the use of RF signals in lieu of the external test pads 212.

The internal bus 208 also couples the CPU 202 to an input/output ("I/O") block 214 as shown. Additional circuitry contained within the RF/ID transponder 200 shown is an RF data modulator/demodulator ("modem") 216 which is coupled to a pair of external antenna pads 218 for receiving signals from an associated RF controller (not shown) and for sending RF signals from the RF/ID transponder 200 to the associated controller.

By use of a memory mapper logic block 206 in accordance with the present invention, an associated NVRAM 62 (FIG. 2) incorporated in the RF/ID transponder 200 may also conveniently include a encryption/decryption logic block 220 wherein access to selected memory locations within the FRAM memory block 204 is controlled by the memory mapper logic and the correspondence between logical addresses supplied by the CPU 202 and the physical addresses actually accessed within the FRAM memory block 204 may be selectably controlled dynamically.

While there have been described above the principles of the present invention in conjunction with specific structure, functionality and applications thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit data processor comprising:
    an arithmetic logic unit in said integrated circuit;
    a memory array in said integrated circuit and addressable by said arithmetic logic unit and selectably configurable as at least one of a read/write portion and a read only portion thereof for at least supplying data to said arithmetic logic unit by means of a data bus.

2. The data processor of claim 1 wherein said read/write portion is capable of storing data for said arithmetic logic unit.

3. The data processor of claim 1 wherein said read/write portion comprises at least one write-protected portion.

4. The data processor of claim 1 wherein said read only portion is capable of storing instructions for operation of said arithmetic logic unit.

5. The data processor of claim 1 wherein said arithmetic logic unit and said memory array are monolithically integrated on a common substrate.

6. The data processor of claim 1 wherein said memory array comprises a non-volatile memory array.

7. The data processor of claim 6 wherein said non-volatile memory array comprises a ferroelectric random access memory.

8. The data processor of claim 7 wherein said ferroelectric random access memory comprises a number of capacitive elements having a lead zirconate titanate dielectric.

9. The data processor of claim 7 wherein said ferroelectric random access memory comprises a number of capacitive elements having a strontium bismuth tantalate dielectric.

10. The data processor of claim 1 further comprising:
    a memory mapper coupling said arithmetic logic unit and said memory array, said memory mapper for receiving a logical address from said arithmetic logic unit and supplying a corresponding physical address to said memory array.

11. The data processor of claim 10 wherein said memory mapper further comprises:
    a non-volatile memory for receiving and storing data indicative of said logical address to said physical address correspondence for said memory mapper.

12. A data processor including an arithmetic logic unit, said data processor comprising:
    a memory array addressable by said arithmetic logic unit and selectably configurable as at least one of a read/write portion and a read only portion thereof for at least supplying data to said arithmetic logic unit by means of a data bus, said at least one read/write portion and said at least one read only portion of said memory array being dynamically programmable; and
    a memory mapper coupling said arithmetic logic unit and said memory array, said memory mapper for receiving a logical address from said arithmetic logic unit and supplying a corresponding physical address to said memory array.

13. The data processor of claim 10 wherein said non-volatile memory is a ferroelectric memory.

14. A data processor including an arithmetic logic unit, said data processor comprising:
    a memory array addressable by said arithmetic logic unit and selectably configurable as at least one of a read/write portion and a read only portion thereof for at least supplying data to said arithmetic logic unit by means of a data bus, configuration data for said data processor being storable in said memory array.

15. The data processor of claim 14 wherein said configuration data is placed on said data bus upon reset of said data processor.

16. A data processor including an arithmetic logic unit, said data processor comprising:
    a memory array addressable by said arithmetic logic unit and selectably configurable as at least one of a read/write portion and a read only portion thereof for at least supplying data to said arithmetic logic unit by means of a data bus; and a memory mapper coupling said arithmetic logic unit and said memory array, said memory mapper for receiving a logical address from said arithmetic logic unit and supplying a corresponding physical address to said memory array, said memory mapper being configured to provide encryption for data in said memory array by translation of said logical address to said physical address.

17. An integrated data processor comprising:

an arithmetic logic unit;

a memory array accessible by said arithmetic logic unit for storing data therein;

a memory mapper coupling said arithmetic logic unit and said memory array, said memory mapper for receiving a logical address from said arithmetic logic unit and supplying a corresponding physical address to said memory array, said memory array being addressable by said arithmetic logic unit and selectively configurable as at least one of a read/write portion and a read only portion thereof for at least supplying data to said arithmetic logic unit means.

18. A data processor including an arithmetic logic unit and a memory array accessible by said arithmetic logic unit for storing data therein, said data processor comprising:

a memory mapper coupling said arithmetic logic unit and said memory array, said memory mapper for receiving a logical address from said arithmetic logic unit and supplying a corresponding physical address to said memory array; and a non-volatile memory for receiving and storing data indicative of said logical address to said physical address correspondence for said memory mapper.

19. The data processor of claim 17 wherein said memory array is addressable by said arithmetic logic unit and selectably configurable as at least one of a read/write portion and a read only portion thereof for at least supplying data to said arithmetic logic unit by means of a data bus.

20. The data processor of claim 19 wherein said read/write portion of said memory array is capable of storing data for said arithmetic logic unit.

21. The data processor of claim 19 wherein said read/write portion comprises at least one write-protected portion.

22. The data processor of claim 19 wherein said read only portion of said memory array is capable of storing instructions for operation of said arithmetic logic unit.

23. The data processor of claim 17 wherein said arithmetic logic unit and said memory mapper are monolithically integrated on a common substrate.

24. The data processor of claim 17 wherein said memory array comprises a non-volatile memory array.

25. The data processor of claim 24 wherein said non-volatile memory array comprises a ferroelectric random access memory.

26. The data processor of claim 25 wherein said ferroelectric random access memory comprises a number of capacitive elements having a lead zirconate titanate dielectric.

27. The data processor of claim 25 wherein said ferroelectric random access memory comprises a number of capacitive elements having a strontium bismuth tantalate dielectric.

28. A data processor including an arithmetic logic unit and a memory array accessible by said arithmetic logic unit for storing data therein, said data processor comprising:

a memory mapper coupling said arithmetic logic unit and said memory array, said memory mapper for receiving a logical address from said arithmetic logic unit and supplying a corresponding physical address to said memory array, configuration data for said data processor being storable in said memory array.

29. The data processor of claim 28 wherein said configuration data is placed on said data bus upon reset of said data processor.

30. A data processor including an arithmetic logic unit and a memory array accessible by said arithmetic logic unit for storing data therein, said data processor comprising:

a memory mapper coupling said arithmetic logic unit and said memory array, said memory mapper for receiving a logical address from said arithmetic logic unit and supplying a corresponding physical address to said memory array, said memory mapper being configured to provide encryption for data in said memory array by translation of said logical address to said physical address.

31. An integrated circuit comprising:

a memory mapper having an input bus for receiving logical addresses from an address source coupled thereto and an output bus for supplying physical addresses thereon corresponding to said logical addresses; and a memory array coupled to said output bus, said memory array being selectably configurable as at least one of a read/write portion and a read only portion thereof for supplying data to a data bus corresponding to said physical addresses on said output bus.

32. The integrated circuit of claim 31 wherein said memory array comprises a non-volatile memory array.

33. The integrated circuit of claim 32 wherein said non-volatile memory array comprises a ferroelectric random access memory.

34. The integrated circuit of claim 33 wherein said ferroelectric random access memory comprises a number of capacitive elements having a lead zirconate titanate dielectric.

35. The integrated circuit of claim 33 wherein said ferroelectric random access memory comprises a number of capacitive elements having a strontium bismuth tantalate dielectric.

36. The integrated circuit of claim 31 wherein said address source comprises an arithmetic logic unit monolithically integrated with said memory mapper and said memory array.

37. The integrated circuit of claim 31 wherein said memory mapper further comprises:

a non-volatile memory for receiving and storing data indicative of said logical address to said physical address correspondence for said memory mapper.

38. An integrated circuit comprising:

a memory mapper having an input bus for receiving logical addresses from an address source coupled thereto and an output bus for supplying physical addresses thereon corresponding to said logical addresses; and a memory array coupled to said output bus, said memory array being selectably configurable as at least one of a read/write portion and a read only portion thereof for supplying data to a data bus corresponding to said physical addresses on said output bus, said at least one read/write portion and said at least one read only portion of said memory array being dynamically programmable: and a non-volatile memory for receiving and storing data indicative of said logical address to said physical address correspondence for said memory mapper.

39. The integrated circuit of claim 37 wherein said non-volatile memory is a ferroelectric memory.

40. An integrated circuit comprising:
a memory mapper having an input bus for receiving logical addresses from an address source coupled thereto and an output bus for supplying physical addresses thereon corresponding to said logical addresses; and
a memory array coupled to said output bus, said memory array being selectably configurable as at least one of a read/write portion and a read only portion thereof for supplying data to a data bus corresponding to said physical addresses on said output bus, said memory mapper being configured to provide encryption for data in said memory array by translation of said logical addresses to said physical addresses.

41. An RF/ID transponder including an antenna coupled to an RF data modem for receiving and transmitting data between said transponder and an associated RF controller, said RF data modem being coupled to a central processing unit disposed within said transponder through a bidirectional bus for reading data therefrom and writing data thereto, said transponder comprising:
a memory array addressable by said central processing unit and selectably configurable as at least one of a read/write portion and a read only portion thereof for at least supplying data to said central processing unit by means of said bidirectional bus.

42. The transponder of claim 41 wherein said read/write portion of said memory array is capable of storing data for said central processing unit.

43. The transponder of claim 41 wherein said read/write portion comprises at least one write-protected portion.

44. The transponder of claim 41 wherein said read only portion of said memory array is capable of storing instructions for operation of said central processing unit.

45. The transponder of claim 41 wherein said central processing unit, said RF modem and said memory array are monolithically integrated on a common substrate.

46. The transponder of claim 41 wherein said memory array comprises a non-volatile memory array.

47. The transponder of claim 46 wherein said non-volatile memory array comprises a ferroelectric random access memory.

48. The transponder of claim 47 wherein said ferroelectric random access memory comprises a number of capacitive elements having a lead zirconate titanate dielectric.

49. The transponder of claim 47 wherein said ferroelectric random access memory comprises a number of capacitive elements having a strontium bismuth tantalate dielectric.

50. The transponder of claim 41 further comprising:
a memory mapper coupling said central processing unit and said memory array, said memory mapper for receiving a logical address from said central processing unit and supplying a corresponding physical address to said memory array.

51. The transponder of claim 50 wherein said memory mapper further comprises:
a non-volatile memory for receiving and storing data indicative of said logical address to said physical address correspondence for said memory mapper.

52. An RF/ID transponder including an antenna coupled to an RF data modem for receiving and transmitting data between said transponder and an associated RF controller, said RF data modem being coupled to a central processing unit through a bidirectional bus for reading data therefrom and writing data thereto; said transponder comprising:
a memory array addressable by said central processing unit and selectably configurable as at least one of a read/write portion and a read only portion thereof for at least supplying data to said central processing unit by means of said bidirectional bus, said at least one read/write portion and said at least one read only portion of said memory array being dynamically programmable;
a memory mapper coupling said central processing unit and said memory array, said memory mapper for receiving a logical address from said central processing unit and supplying a corresponding physical address to said memory array; and
a non-volatile memory for receiving and storing data indicative of said logical address to said physical address correspondence for said memory mapper.

53. The transponder of claim 51 wherein said non-volatile memory is a ferroelectric memory.

54. An RF/ID transponder including an antenna coupled to an RF data modem for receiving and transmitting data between said transponder and an associated RF controller, said RF data modem being coupled to a central processing unit through a bidirectional bus for reading data therefrom and writing data thereto; said transponder comprising:
a memory array addressable by said central processing unit and selectably configurable as at least one of a read/write portion and a read only portion thereof for at least supplying data to said central processing unit by means of said bidirectional bus, configuration data for said central processing unit being storable in said memory array.

55. The transponder of claim 54 wherein said configuration data is placed on said data bus upon reset of said central processing unit.

56. An RF/ID transponder including an antenna coupled to an RF data modem for receiving and transmitting data between said transponder and an associated RF controller, said RF data modem being coupled to a central processing unit through a bidirectional bus for reading data therefrom and writing data thereto: said transponder comprising:
a memory array addressable by said central processing unit and selectably configurable as at least one of a read/write portion and a read only portion thereof for at least supplying data to said central processing unit by means of said bidirectional bus;
a memory mapper coupling said central processing unit and said memory array, said memory mapper for receiving a logical address from said central processing unit and supplying a corresponding physical address to said memory array, said memory mapper being configured to provide encryption for data in said memory array by translation of said logical address to said physical address.

57. A data processor comprising:
an arithmetic logic unit;
a memory array addressable by said arithmetic logic unit and selectably and dynamically configurable as at least one of a read/write portion and a read only portion thereof for at least supplying data to said arithmetic logic unit by means of a data bus.

* * * * *